(12) United States Patent
Zheng (10) Patent No.: US 10,062,358 B2
(45) Date of Patent: Aug. 28, 2018

(54) ELECTRONIC DEVICE WITH AMBIENT LIGHT SENSOR ANALOG-TO-DIGITAL CONVERTER

(71) Applicant: Apple Inc., Cupertino, CA (US)

(72) Inventor: Dong Zheng, Los Altos, CA (US)

(73) Assignee: Apple Inc., Cupertino, CA (US)

(*) Notice: Subject to any disclaimer, the term of this patent is extended or adjusted under 35 U.S.C. 154(b) by 170 days.

(21) Appl. No.: 15/259,303

(22) Filed: Sep. 8, 2016

(65) Prior Publication Data

US 2017/0084251 A1   Mar. 23, 2017

Related U.S. Application Data

(60) Provisional application No. 62/221,539, filed on Sep. 21, 2015.

(51) Int. Cl.
| | |
|---|---|
| *G01N 21/00* | (2006.01) |
| *G09G 5/10* | (2006.01) |
| *G01J 1/42* | (2006.01) |
| *G01J 1/44* | (2006.01) |
| *H03M 1/38* | (2006.01) |

(52) U.S. Cl.
CPC .............. *G09G 5/10* (2013.01); *G01J 1/4204* (2013.01); *G01J 1/44* (2013.01); *H03M 1/38* (2013.01); *G09G 2320/0626* (2013.01); *G09G 2360/144* (2013.01)

(58) Field of Classification Search
CPC .......... H01L 31/02016; H01L 31/02002; G01J 1/4204; G01J 1/44; G01J 1/46; G09G 5/10

USPC .......................................................... 356/72
See application file for complete search history.

(56) References Cited

U.S. PATENT DOCUMENTS

| | | | |
|---|---|---|---|
| 7,550,703 B2 | 6/2009 | Bechtel et al. | |
| 8,134,623 B2* | 3/2012 | Purcell | H04N 5/3355 |
| | | | 348/294 |
| 8,735,795 B2 | 5/2014 | Qiao et al. | |
| 8,779,781 B2 | 7/2014 | Nguyen et al. | |
| 8,878,830 B2 | 11/2014 | Raynor et al. | |
| 8,987,652 B2 | 3/2015 | Zheng | |
| 9,000,345 B2* | 4/2015 | Liu | G01J 1/46 |
| | | | 250/214 AL |

(Continued)

*Primary Examiner* — Calvin C Ma (74) *Attorney, Agent, or Firm* — Treyz Law Group, P.C.; G. Victor Treyz (57) ABSTRACT

An electronic device may be provided with an ambient light sensor. An analog-to-digital converter may be used to digitize ambient light measurements made with the ambient light sensor. Control circuitry in the electronic device may be used to adjust the brightness of a display and take other actions in the electronic device based on the digitized ambient light measurements. The analog-to-digital converter may be a hybrid analog-to-digital converter having a most-significant-bit analog-to-digital converter circuit branch based on an integrating analog-to-digital converter and a least-significant-bit analog-to-digital converter circuit branch based on a successive-approximation-register analog-to-digital converter. The most-significant-bit branch may produce an output based a reset count for an integrator that is reset a number of times during a measurement period. The least-significant-bit branch may produce an output by digitizing an output from the integrator upon termination of the measurement period.

20 Claims, 6 Drawing Sheets

(56) References Cited

U.S. PATENT DOCUMENTS 9,739,659 B2 * 8/2017 Xu ..................... G01J 1/4204

* cited by examiner

ELECTRONIC DEVICE WITH AMBIENT LIGHT SENSOR ANALOG-TO-DIGITAL CONVERTER

This application claims the benefit of provisional patent application No. 62/221,539, filed Sep. 21, 2015, which is hereby incorporated by reference herein in its entirety.

BACKGROUND

This relates generally to electronic devices and, more particularly, to electronic devices with light sensors.

Electronic devices often include light sensors. For example, some devices may include ambient light sensors to allow the devices to monitor ambient lighting conditions. A user of a portable device may often move between dim and bright lighting environments such as when transitioning between indoor and outdoor environments. Ambient light sensor readings may be taken in this type of device so that automatic display brightness adjustments may be made. When an increase in ambient light level is detected, control circuitry within the device may automatically increase the brightness of the display in the device to compensate for the additional glare and brightness associated with a bright ambient environment. This allows a user to view content on the display without interruption. When a decrease in ambient light level is detected, the control circuitry may automatically lower display brightness to a level that is appropriate for dim ambient lighting conditions.

Analog-to-digital converter circuitry may be used to digitize analog signals from ambient light sensors. If care is not taken, the digital output of the analog-to-converter circuitry may not be as accurate as desired. For example, some analog-to-digital converter circuits may be disrupted when exposed to light from light sources such as light-emitting diodes or fluorescent lamps that are characterized by spikes in light intensity.

It would therefore be desirable to be able to provide electronic devices with enhanced light sensor processing circuitry.

SUMMARY

An electronic device may be provided with an ambient light sensor. An analog-to-digital converter may be used to digitize ambient light measurements made with the ambient light sensor. Control circuitry in the electronic device may be used to adjust the brightness of a display and take other actions in the electronic device based on the digitized ambient light measurements.

The analog-to-digital converter may be a hybrid analog-to-digital converter having a most-significant-bit analog-to-digital converter circuit branch and a least-significant-bit analog-to-digital converter circuit branch. The most-significant-bit analog-to-digital converter branch may be based on an integrating analog-to-digital converter circuit. The least-significant-bit analog-to-digital converter may be based on a successive-approximation-register analog-to-digital converter circuit or pipeline analog-to-digital converter circuit.

The most-significant-bit branch may produce an output based a reset count for an integrator that is reset a number of times during a measurement period. The least-significant-bit branch may produce an output by digitizing an output from the integrator upon termination of the measurement period.

DETAILED DESCRIPTION

Electronic devices may be provided with analog-to-digital converter circuitry for digitizing signals from sensors and other input-output devices. Configurations in which electronic devices have analog-to-digital converter circuitry that digitizes analog light sensor signals such as signals from an ambient light sensor may sometimes be described herein as an example.

Figure 1:
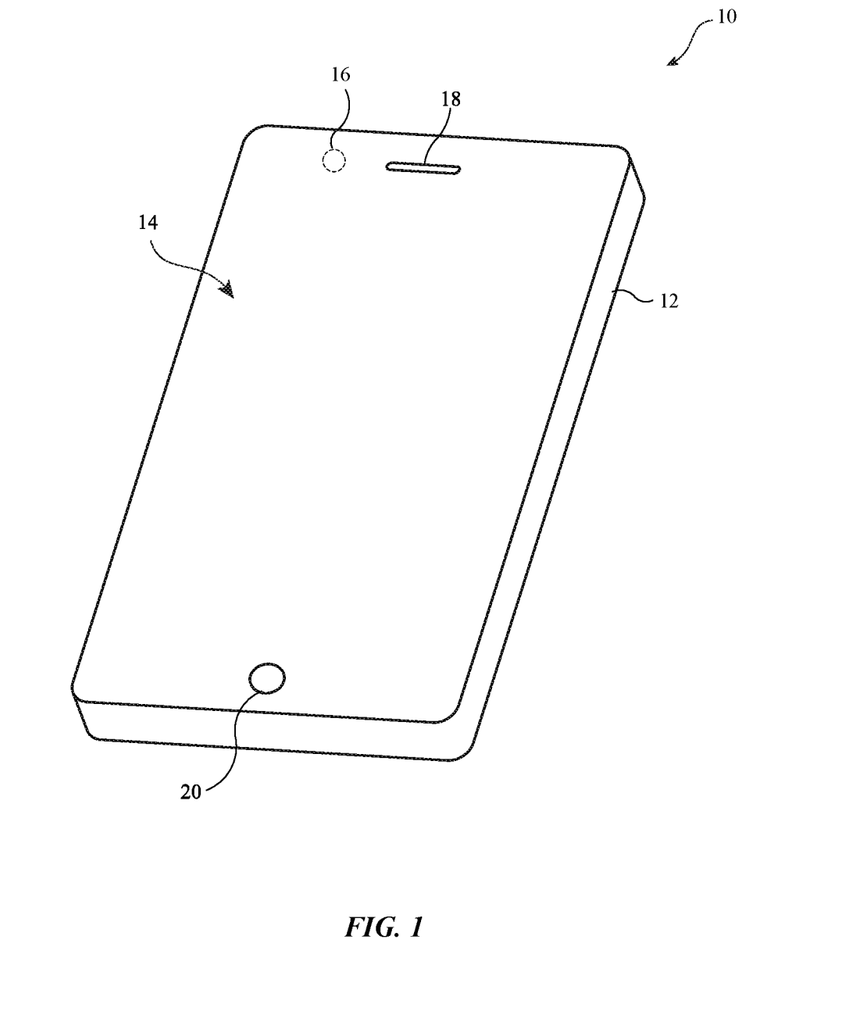
FIG. 1 is a perspective view of an illustrative electronic device of the type that may include a light sensor in accordance with an embodiment.

An illustrative electronic device that may be provided with an ambient light sensor is shown in FIG. 1. Electronic devices such as device 10 of FIG. 1 may be cellular telephones, media players, other handheld portable devices, somewhat smaller portable devices such as wrist-watch devices, pendant devices, or other wearable or miniature devices, gaming equipment, tablet computers, notebook computers, desktop computers, televisions, computer monitors, computers integrated into computer displays, or other electronic equipment.

In the example of FIG. 1, device 10 includes a display such as display 14. Display 14 has been mounted in a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive.

Display 14 may include an array of pixels formed from liquid crystal display (LCD) components, an array of electrophoretic pixels, an array of plasma pixels, an array of organic light-emitting diode pixels, an array of electrowetting pixels, or pixels based on other display technologies. The brightness of display 14 may be adjustable. For example, display 14 may include a backlight unit formed from a light source such as a lamp or light-emitting diodes that can be used to increase or decrease display backlight levels and thereby adjust display brightness. Display 14 may also include organic light-emitting diode pixels or other pixels with adjustable intensities. In this type of display, display brightness can be adjusted by adjusting the intensities of drive signals used to control individual display pixels.

Display 14 may be protected using a display cover layer such as a layer of transparent glass or clear plastic. In the center of display 14, display 14 may contain an array of active display pixels. This region is sometimes referred to as the active area of the display. A rectangular ring-shaped region surrounding the periphery of the active display region may not contain any active display pixels and may therefore sometimes be referred to as the inactive area of the display. The display cover layer or other display layers in display 14 may be provided with an opaque masking layer in the inactive region to hide internal components from view by a user.

Openings may be formed in the display cover layer. For example, an opening may be formed in the display cover layer to accommodate a button such as button 20. An opening may also be formed in the display cover layer to accommodate ports such as speaker port 18. An ambient light sensor for device 10 may be mounted under ambient light sensor window 16 (e.g., an opening in the opaque masking layer formed on the underside of the display cover layer in the inactive area of display 14) or may be mounted elsewhere in housing 12.

Figure 2:
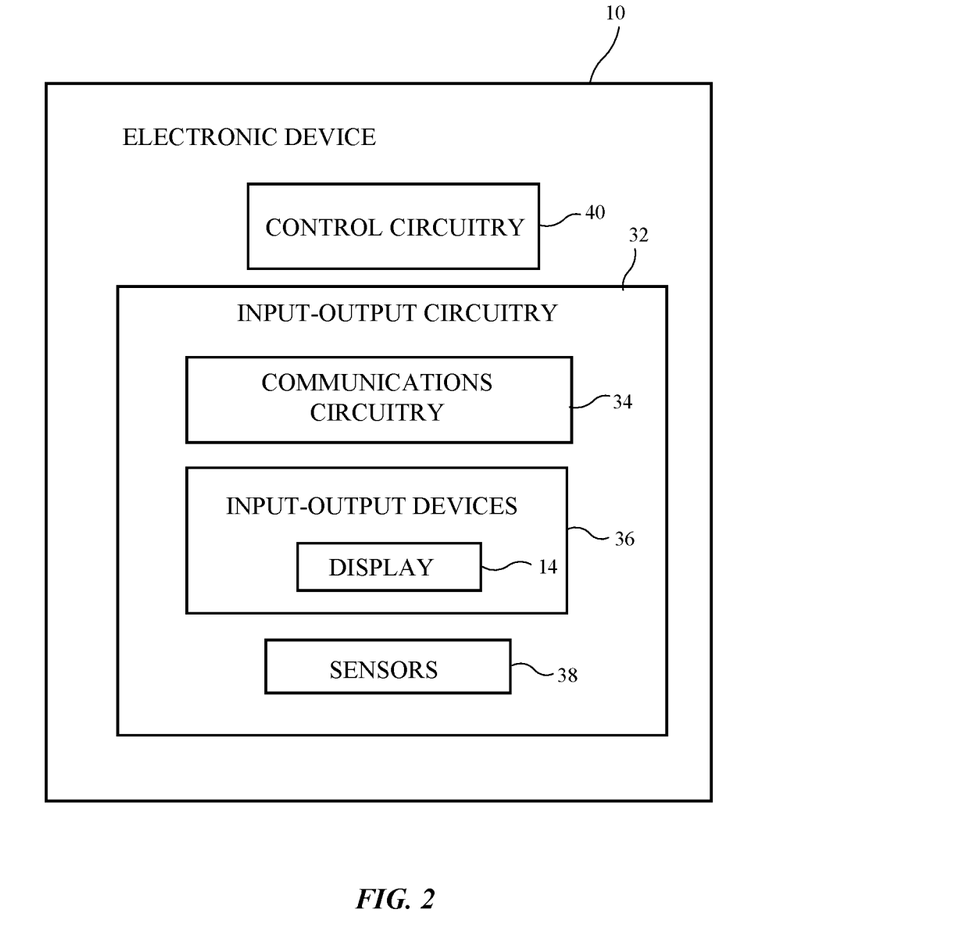
FIG. 2 is a schematic diagram of an electronic device of the type shown in FIG. 1 in accordance with an embodiment.

A schematic diagram of device 10 is shown in FIG. 2. As shown in FIG. 2, electronic device 10 may include storage and processing circuitry such as control circuitry 40. Control circuitry 40 may include one or more different types of storage such as hard disk drive storage, nonvolatile memory (e.g., flash memory or other electrically-programmable-read-only memory), volatile memory (e.g., static or dynamic random-access-memory), etc. Processing circuitry in control circuitry 40 may be used in controlling the operation of device 10. The processing circuitry may be based on a processor such as a microprocessor and other suitable integrated circuits. With one suitable arrangement, control circuitry 40 may be used to run software on device 10 such as internet browsing applications, email applications, media playback applications, operating system functions, software for capturing and processing images, software implementing functions associated with gathering and processing light sensor data and other sensor data, software that makes adjustments to display brightness based on ambient light sensor readings and other input, software that makes adjustments to touch sensor functionality, etc.

Input-output circuitry 32 may be used to allow input to be supplied to device 10 from a user or external devices and to allow output to be provided from device 10 to the user or external devices.

Input-output circuitry 32 may include wired and wireless communications circuitry 34. Communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Input-output circuitry 32 may include input-output devices 36 such as button 20 of FIG. 1, joysticks, click wheels, scrolling wheels, a touch screen such as display 14 of FIG. 1, other touch sensors such as track pads or touch-sensor-based buttons, vibrators, audio components such as microphones and speakers, image capture devices such as a camera module having an image sensor and a corresponding lens system, keyboards, status-indicator lights, tone generators, key pads, and other equipment for gathering input from a user or other external source and/or generating output for a user.

Sensor(s) 38 of FIG. 2 may include an ambient light sensor for gathering information on ambient light levels, proximity sensor components (e.g., light-based proximity sensors and/or proximity sensors based on other structures), accelerometers, gyroscopes, magnetic sensors, and other sensor structures. Configurations in which sensor 38 is an ambient light sensor that produces an analog output that is digitized by a hybrid analog-to-digital converter may sometimes be described herein as an example. This is, however, merely illustrative. Hybrid analog-to-digital converter circuitry may be used to digitize any suitable analog signals such as analog signals from sensors other than ambient light sensors or other signals produced by circuitry 32.

Ambient light sensor signals from an ambient light sensor 38 may be digitized by a hybrid analog-to-digital converter that has multiple branches. The hybrid analog-to-digital converter may, for example, have two branches. A first of the branches may be used to produce the most significant bits of the digital output of the analog-to-digital converter, whereas a second of the branches may be used to produce the least significant bits of the digital output of the analog-to-digital converter.

The hybrid analog-to-digital converter may produce any suitable number of bits of output. As an example, the hybrid analog-to-digital converter may produce 16 bits of output. In this illustrative scenario, the eight most significant bits of the digital output of the hybrid analog-to-digital converter may be produced by the most-significant-bit branch of the analog-to-digital converter and the eight least significant bits of the digital output of the hybrid analog-to-digital converter may be produced by the least-significant-bit branch of the analog-to-digital converter. Different numbers of bits may be associated with the most-significant-bit and least-significant-bit branches of the hybrid analog-to-digital converter. An arrangement in which eight bits are allocated to the most-significant-bit branch and eight bits are allocated to the least-significant-bit branch is merely illustrative.

The hybrid analog-to-digital converter may use an integrating analog-to-digital converter circuit to form the most-significant-bit branch. This type of analog-to-digital converter circuit uses an integrator with an integrating capacitor to integrate current produced by the ambient light sensor (or other analog input). The output of the integrator can be compared to a reset voltage. The integrator (i.e., the integrating capacitor) can be reset whenever the reset voltage is exceeded. The number of times that the integrating capacitor charges up to the reset voltage and that the integrator is reset can be counted to produce a digital output.

To reduce the likelihood that the most-significant-bit branch of the analog-to-digital converter will be saturated due to light intensity spikes (e.g., spikes in light intensity due to the presence of a light-emitting-diode light source or compact fluorescent light or other source that produces light intensity spikes), the size of the integrating capacitor can be enlarged. The use of a large integrating capacitor helps reduce the sensitivity of the integrating analog-to-digital converter circuit to light intensity spikes, but reduces the sensitivity of the integrating analog-to-digital converter circuit. Because the integrating analog-to-digital converter circuit is being used to handle only the most significant bits for the hybrid analog-to-digital converter, however, the use of the large integrating capacitor will not adversely affect the accuracy of the hybrid converter.

The least-significant-bit branch of the hybrid analog-to-digital converter can be used to restore sensitivity to the analog-to-digital converter that has been lost by increasing the value of the integrating capacitance to reduce the vulnerability of the converter to light intensity spikes. In particular, the least-significant-bit branch of the hybrid analog-to-digital converter can be used to measure the voltage output of the integrating capacitor, even when the voltage on the integrating capacitor does not exceed the reset voltage.

Any suitable type of analog-to-digital converter circuit may be used for the least-significant-bit branch of the analog-to-digital converter. For example, fast analog-to-digital converter circuits such as pipeline analog-to-digital converter circuits and successive-approximation-register analog-to-digital converter circuits may be used to implement the least-significant-bit branch of the analog-to-digital converter.

Figure 3:
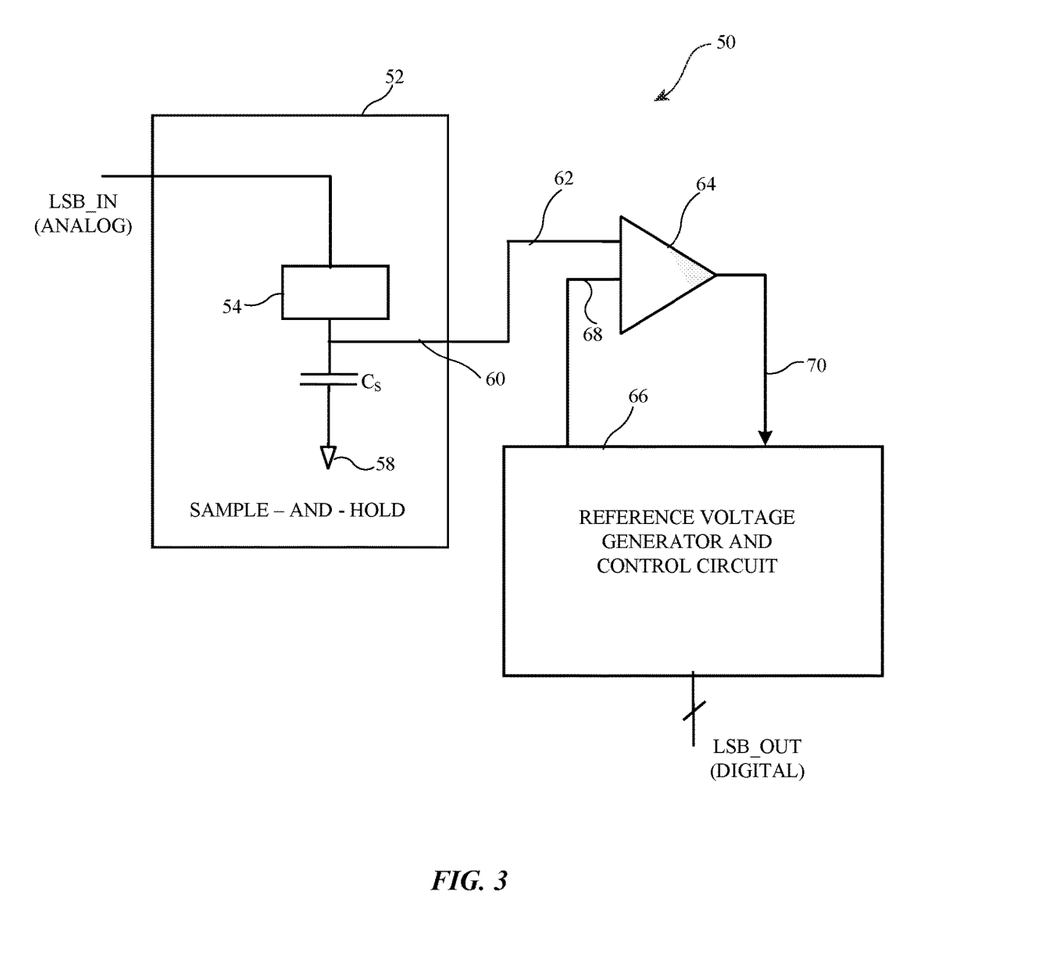
FIG. 3 is a circuit diagram of a successive-approximation-register analog-to-digital converter circuit in accordance with an embodiment.

An illustrative successive-approximation-register analog-to-digital converter circuit of the type that may be used in the hybrid analog-to-digital converter is shown in FIG. 3. As shown in FIG. 3, successive-approximation-register analog-to-digital converter circuit 50 may contain a sample-and-hold circuit such as circuit 52. An analog input signal LSB_IN may be received by circuit 52. Storage capacitor Cs may be coupled between switch 54 and ground 58. Switch 54 may be closed to charge storage capacitor Cs. The resulting stored voltage (i.e., voltage LSB_IN) on output line 60 may be received by first input 62 of comparator 64. Reference voltage generator and control circuit 66 generates a series of reference voltage values on line 68. As each reference voltage is placed on line 68 (i.e., the second input of comparator 64), comparator 64 produces a corresponding output on line 70 indicating whether or not the voltage on line 62 exceeds the reference voltage.

The reference voltages may, as an example, start with a value that is one half of the full range of voltages accepted by input 62. For example, if the maximum permitted voltage on input 62 is 1 volt, the initial reference voltage produced on line 68 may be 0.5 volts. Based on the comparison of the 0.5 V reference voltage to LSB_IN, circuit 66 can produce another reference voltage to compare to LSB_IN. If, as an example, the value of LSB_IN was determined to be less than 0.5 volts, circuit 66 may produce a voltage of 0.25 V as the next reference voltage to compare against LSB_IN. By making progressively finer adjustments (successive approximations) to the reference voltage in this way, circuit 66 can accurately identify the analog value of LSB_IN and produce a corresponding digital version of LSB_IN at output LSB_OUT of circuit 66.

Figure 4:
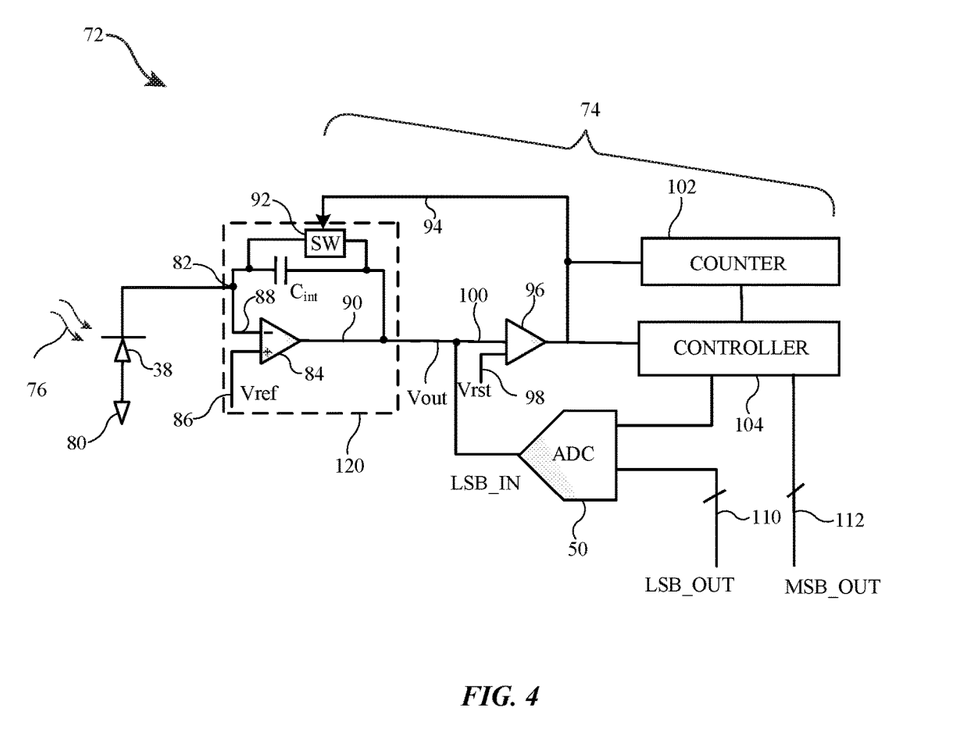
FIG. 4 is a schematic diagram of an illustrative hybrid analog-to-digital converter that has a most significant bit branch and a least significant bit branch in accordance with an embodiment.

FIG. 4 is a diagram showing how an analog-to-digital converter circuit such as circuit 50 of FIG. 3 may be incorporated into a hybrid analog-to-digital converter circuit. As shown in FIG. 4, hybrid analog-to-digital converter 72 may include an integrating analog-to-digital converter circuit that forms most-significant-bit analog-to-digital converter branch 74 and a successive-approximation register analog-to-digital converter or other analog-to-digital converter circuit that forms least-significant-bit analog-to-digital converter branch 50.

Analog-to-digital converter 72 of FIG. 4 may be used in gathering and processing an analog signal on input node 82 and producing a corresponding digital output on outputs 110 and 112. The digital output on outputs 110 and 112 may include a most significant bit portion (MSB_OUT) on output 112 and a least significant bit portion (LSB_OUT) on output 110. Taken together, the bits of MSB_OUT and LSB_OUT represent a digitized version of the analog signal produced by light sensor 38 on node 82.

In the example of FIG. 4, the signal supplied to node 82 corresponds to the current output of ambient light sensor 38. During operation, ambient light 76 is received by ambient light sensor 38. Ambient light sensor 38 may be coupled between ground 80 and input 82 of analog-to-digital converter 72. The ambient light sensor signal supplied to input 82 may be processed and digitized by converter 72 to produce a corresponding digital output on outputs 110 and 112.

Branch 74 may have an integrator such as integrator 120. The output of integrator 120 may be monitored by a monitoring circuit such as comparator 96. Comparator 96 has a first input such as input 100 that receives the output from integrator 120 on output line 90 (sometimes referred to as the integrator output or operation amplifier output) and has a second input such as input 98 on which a reference voltage (threshold voltage) such as reset voltage Vrst is maintained.

Integrator 106 may include an operational amplifier such as operational amplifier 84. Operational amplifier 84 may have an integrating input such as input 88 (sometimes referred to as a negative input or current integration node) and may have a reference input (sometimes referred to as a positive input) such as input 86, which is coupled to reference voltage source Vref. Integrating capacitor Cint may be coupled in a feedback path between output 90 of operational amplifier 84 and negative input 88. During operation, comparator 96 may monitor the voltage on output 90 and may create an output on control line 94 whenever the voltage on output 90 exceeds reset voltage Vrst. The control signal (sometimes referred to as a reset signal or reset control signal) on path 94 may be used to close switch 92 (which is coupled across capacitor Cint) and thereby reduce the voltage across integrating capacitor Cint to zero, resetting integrator 120.

Each integration operation in which the output voltage on output 90 rises to reset voltage Vrst and resets integrator 120 produces a corresponding output pulse on path 94 that is counted by counter 102. Controller 104 can use counter 102 to count the pulses produced on path 94 (e.g., the output of comparator 96 which changes to reflect the resets of integrator 120) in a given measurement period T (e.g., a period of about 1-5 ms, more than 2 ms, less than 4 ms, or other suitable time period). The number of pulses counted during time period T (i.e., count N, which may sometimes be referred to as a pulse count, reset count, integrator reset count, etc.) can be used by controller 104 to create most-significant-bit output MSB_OUT on output 112 (i.e., MSB_OUT may be computed from N; when N is low, MSB_OUT will be low and when N is high, MSB_OUT will be high).

In situations in which the voltage on the output Vout of integrator 90 does not rise to Vrst, pulse count N will not be incremented by counter 102. Nevertheless, this voltage (shown as voltage Vout at the output of integrator 120 and as LSB_IN at the input of branch 50 in FIG. 4) may be digitized using a successive-approximation register analog-to-digital converter of the type shown in FIG. 3 or other analog-to-digital converter for least-significant-bit analog-to-digital converter branch 50. Branch 50 may digitize LSB_IN and produce a corresponding digitized version of this signal (LSB_OUT) on output 110 whereas branch 74 may produce output MSB_OUT on output 112.

Figure 5:
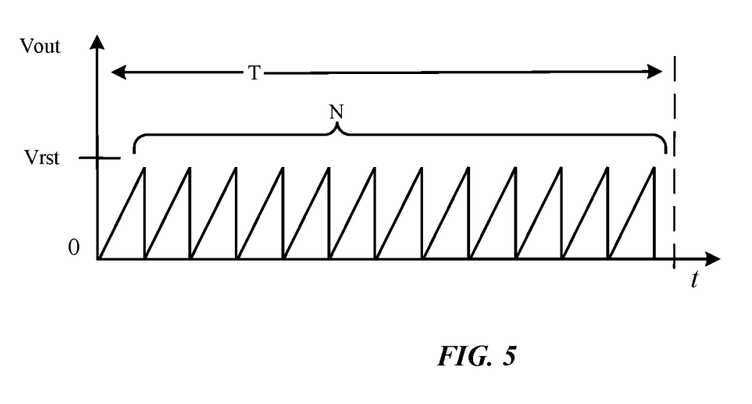
FIG. 5 is a graph showing how the output of an integrating analog-to-digital converter circuit in the hybrid analog-to-digital converter of FIG. 4 may produce a reset count corresponding to how many times an integrator is reset during a measurement period and may produce a most-significant-bit output based on the reset count in accordance with an embodiment.

A graph showing how the output Vout of integrator 120 may repeatedly rise to Vrst during measurement period T is shown in FIG. 5. Each time Vout reaches Vrst, comparator 96 will generate a reset signal on path 94 that closes switch 92 and resets integrator 120 and takes Vout to 0 volts. The number of pulses N that are counted by counter 102 during measurement period T may be used by controller 104 in generating the most-significant-bit output MSB_OUT on output 112.

Figure 6:
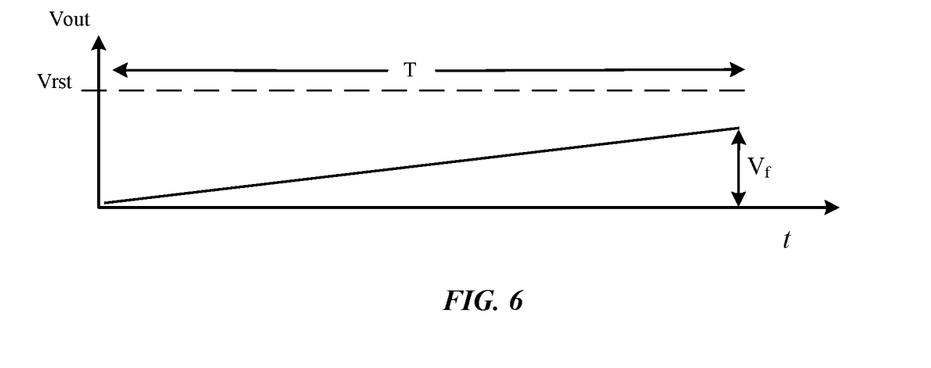
FIG. 6 is a graph showing how an analog-to-digital converter circuit such as a successive-approximation-register analog-to-digital converter circuit may be used to produce least significant bit output for the hybrid analog-to-digital converter of FIG. 4 by digitizing the output voltage of the integrator upon termination of the measurement period in accordance with an embodiment.

In some situations, Vout will only partly rise to Vrst (e.g., because a full pulse cannot be integrated within time period T or the amount of time period T that is left after a preceding pulse has been reset). Consider, as an example, the scenario illustrated in the graph of FIG. 6. In this scenario, the amount of ambient light 76 that is received by ambient light sensor 38 is relatively weak. As a result, even after integrating the current from sensor 38 for time period T, the voltage Vout on output 90 (i.e., LSB_IN) has risen to only Vf upon termination of period T. Because Vf is less than Vrst, comparator 96 will not generate a reset pulse on line 94 and integrator 120 will not be reset. Nevertheless, the value of Vout (i.e., voltage value Vf in this example) can serve as input signal LSB_IN to branch 50 and can be digitized to produce least-significant-bit output LSB_OUT at output 110.

During operation of hybrid converter 72, branches 74 and 50 may be used in parallel. Branch 74 may count the number N of pulses that are produced at the output of integrator 120 within measurement period T (i.e., the reset count for integrator 120), as described in connection with FIG. 5 to produce MSB_OUT. Branch 50 may digitize the output Vout of integrator 90 that is present upon termination of measurement period T to produce LSB_OUT. The digital output (digital word) of converter 72 that is made up of the combination of MSB_OUT and LSB_OUT corresponds to a digitized version of the input supplied to node 82 from ambient light sensor 38. The digital output of converter 72 may be used by control circuitry 40 to adjust display brightness of display 14 and/or to make other adjustments to the operation of device 10.

The foregoing is merely illustrative and various modifications can be made by those skilled in the art without departing from the scope and spirit of the described embodiments. The foregoing embodiments may be implemented individually or in any combination.

What is claimed is:

1. Circuitry, comprising:
a sensor;
an analog-to-digital converter that receives input from the sensor at an input node and that supplies a corresponding digital output that includes most significant bits and least significant bits, the analog-to-digital converter comprising:
a first analog-to-digital converter circuit branch that includes an integrator coupled to the input node and circuitry that resets the integrator whenever an output from the integrator exceeds a reset voltage, wherein the integrator is reset a number of times during a measurement period, wherein the first analog-to-digital converter circuit branch includes a controller, and wherein the most significant bits are produced by the controller based on the number of times the integrator is reset during the measurement period; and
a second analog-to-digital converter circuit branch that produces the least significant bits by digitizing the output from the integrator upon termination of the measurement period.

2. The circuitry defined in claim 1 wherein the sensor comprises an ambient light sensor.

3. The circuitry defined in claim 2 wherein the first analog-to-digital converter circuit branch further comprises a comparator having a first input that receives the output from the integrator and a second input that receives the reset voltage.

4. The circuitry defined in claim 3 wherein the integrator comprises an integrating capacitor and a reset switch that is coupled across the integrating capacitor.

5. The circuitry defined in claim 4 wherein the first analog-to-digital converter circuit branch further comprises a signal path that supplies an output from the comparator to the reset switch so that the reset switch is closed and the integrator is reset whenever the output from the integrator exceeds the reset voltage.

6. The circuitry defined in claim 5 wherein the first analog-to-digital converter circuit branch comprises a counter that counts the number of times that the integrator is reset during a measurement period.

7. The circuitry defined in claim 6 wherein the second analog-to-digital converter circuit branch comprises a successive-approximation-register analog-to-digital converter circuit.

8. The circuitry defined in claim 1 wherein the sensor comprises an ambient light sensor and wherein the second analog-to-digital converter circuit branch comprises a successive-approximation-register analog-to-digital converter circuit.

9. The circuitry defined in claim 8 further comprising:
a display having a brightness; and
control circuitry that adjusts the brightness based on the digital output.

10. The circuitry defined in claim 1 wherein the integrator comprises an operational amplifier having a first input coupled to the input node and a second input that receives a reference voltage.

11. The circuitry defined in claim 10 wherein the operational amplifier has an output line that produces the integrator output and wherein the second analog-to-digital converter circuit branch comprises a successive-approximation-register analog-to-digital converter circuit.

12. An electronic device, comprising:
a display;
an ambient light sensor;
a digital-to-analog converter that digitizes ambient light measurements from the ambient light sensor; and
control circuitry that adjusts the display based on the digitized ambient light measurements, wherein the digital-to-analog converter comprises:
an integrator coupled to the ambient light sensor that produces an integrator output;
a circuit that resets the integrator when the integrator output exceeds a reset voltage so that the integrator is reset a number of times equal to a reset count during a measurement period;
controller and counter circuitry that counts the number of times the integrator is reset during the measurement period to produce the reset count and that produces a set of most significant bits for the digitized ambient light sensor measurement based on the reset count; and an analog-to-digital converter circuit that digitizes the integrator output upon termination of the measurement period to produce a set of least significant bits for the digitized ambient light sensor measurement.

13. The electronic device defined in claim 12 wherein the integrator comprises an operational amplifier having a first input coupled to the ambient light sensor and a second input that receives a reference voltage.

14. The electronic device defined in claim 13 wherein the operational amplifier is coupled to an output line in the integrator that produces the integrator output.

15. The electronic device defined in claim 14 further comprising an integrating capacitor coupled between the output line and the first input.

16. The electronic device defined in claim 15 further comprising a reset switch coupled between the output line and the first input.

17. The electronic device defined in claim 16 wherein the analog-to-digital converter circuit comprises a successive-approximation-register analog-to-digital converter.

18. The electronic device defined in claim 17 wherein the circuit that resets the integrator when the integrator output exceeds the reset voltage comprises a comparator that has a first input coupled to the output line and a second input that receives the reset voltage.

19. An analog-to-digital converter that receives analog input at an input node and that supplies a corresponding digital output that includes most significant bits and least significant bits, the analog-to-digital converter comprising:

a first analog-to-digital converter circuit branch that includes an integrator coupled to the input node and circuitry that resets the integrator whenever an output from the integrator exceeds a reset voltage, wherein the integrator is reset a number of times during a measurement period, wherein the first analog-to-digital converter circuit branch includes a controller, and wherein the most significant bits are produced by the controller based on the number of times the integrator is reset during the measurement period; and a second analog-to-digital converter circuit branch that produces the least significant bits by digitizing the output from the integrator upon termination of the measurement period.

20. The analog-to-digital converter defined in claim 19 wherein the second analog-to-digital converter circuit branch comprises a successive-approximation-register analog-to-digital converter circuit.

* * * * *